(12) United States Patent
Ong et al.

(10) Patent No.: US 7,888,224 B2
(45) Date of Patent: Feb. 15, 2011

(54) METHOD FOR FORMING A SHALLOW JUNCTION REGION USING DEFECT ENGINEERING AND LASER ANNEALING

(75) Inventors: Kuang Kian Ong, Singapore (SG); Sai Hooi Yeong, Singapore (SG); Kin Leong Pey, Singapore (SG); Lap Chan, Singapore (SG); Yung Fu Chong, Singapore (SG)

(73) Assignees: Nanyang Technological University, Singapore (SG); Chartered Semiconductor Manufacturing Ltd., Singapore (SG); National University Of Singapore, Singapore (SG)

( * ) Notice: Subject to any disclaimer, the term of this patent is extended or adjusted under 35 U.S.C. 154(b) by 81 days.

(21) Appl. No.: 12/271,262

(22) Filed: Nov. 14, 2008

(65) Prior Publication Data
US 2010/0124809 A1 May 20, 2010

(51) Int. Cl.
*H01L 21/336* (2006.01)
(52) U.S. Cl. .......... 438/307; 438/305; 438/528
(58) Field of Classification Search .......... 438/305, 438/307, 528
See application file for complete search history.

(56) References Cited

U.S. PATENT DOCUMENTS

| 5,966,605 | A | 10/1999 | Ishida | |
|---|---|---|---|---|
| 6,074,937 | A * | 6/2000 | Pramanick et al. | 438/528 |
| 6,319,761 | B1 | 11/2001 | Zhang et al. | |
| 6,365,446 | B1 | 4/2002 | Chong et al. | |
| 6,372,585 | B1 | 4/2002 | Yu | |
| 6,391,731 | B1 | 5/2002 | Chong et al. | |
| 6,897,118 | B1 | 5/2005 | Poon et al. | |
| 7,598,147 | B2 * | 10/2009 | Liu et al. | 438/305 |
| 2006/0199358 | A1 * | 9/2006 | Mineji | 438/530 |
| 2009/0087971 | A1 * | 4/2009 | Colombeau et al. | 438/542 |

OTHER PUBLICATIONS

Colombeau et al., "Electrical Deactivation and Diffusion of Boron in Preamorphized Ultrashallow Junctions: Interstitial Transport and F co-implant Control", IEEE, Advanced Technology Institute, University of Surrey, Guildford, UK, 4 pgs., 2004.

* cited by examiner

*Primary Examiner*—Phuc T Dang
(74) *Attorney, Agent, or Firm*—Brinks Hofer Gilson & Lione (57) ABSTRACT

A method for forming a shallow junction region in a crystalline semiconductor substrate and method for fabricating a semiconductor device having the shallow junction region includes a defect engineering step in which first ions are introduced into a first region of the substrate and vacancies are generated in the first region. During the generation of substrate vacancies, the first region remains substantially crystalline. Interstitial species are generated in a second region and second ions are introduced into the second region to capture the interstitial species. Laser annealing is used to activate dopant species in the first region and repair implantation damage in the second region. The defect engineering process creates a vacancy-rich surface region in which source and drain extension regions having high dopant activation and low sheet resistance are created in an MOS device.

20 Claims, 5 Drawing Sheets

METHOD FOR FORMING A SHALLOW JUNCTION REGION USING DEFECT ENGINEERING AND LASER ANNEALING

TECHNICAL FIELD

This invention relates, generally, to the fabrication of metal-oxide-semiconductor (MOS) devices and, more particularly, to the formation of shallow junctions in the source and drain regions of MOS transistors.

BACKGROUND

MOS transistors typically include source and drain regions in a crystalline semiconductor substrate aligned to a gate electrode that overlies the substrate. A channel region resides in the substrate below the gate electrode and between the source and drain regions. In order to reduce hot electron injection into the channel region, source and drain extension regions are formed adjacent the channel region on either side of the gate electrode. To adequately reduce hot electron injection, the extension regions need to have a very low dopant concentration and a very shallow junction in the crystalline substrate. This is especially important as device dimensions continue to shrink such that the channel width becomes smaller and smaller.

To function effectively, the source and drain extension regions need to have a very low dopant concentration. As the device dimensions shrink, however, the low dopant concentration of the source and drain extension regions tend to increase the electrical resistance, thus undesirably increasing the source and drain series resistance in the MOS transistor. It is therefore desirable to form shallow extension regions that have the necessary low dopant concentration, which not undesirably increasing the electrical resistance.

U.S. Pat. No. 5,966,605 to Ishida discloses a method for infusing dopant into a polysilicon gate structure by first blanket depositing a dopant enriched layer over the wafer after the polysilicon gate structure has been formed. Laser irradiation is then applied to melt the polysilicon and thereby causing the dopant to be infused therein. The laser energy is not sufficient to melt and cause dopant infusion into the source/drain regions.

U.S. Pat. No. 6,372,585 to Yu discloses that nitrogen, implanted into silicon can be induced to bond within the silicon by pulsed laser annealing.

U.S. Pat. No. 6,319,761 to Zhang, et. al. discloses that annealing of ion implanted source/drain regions with an excimer laser improves crystallinity and repairs implant damage.

U.S. Pat. No. 6,365,446 to Chong, et. al., assigned to the present assignee, discloses a method for simultaneously forming silicide contact regions and source/drain regions by first, amorphizing the designated regions by ion implantation of Ge, As, or Ar, next depositing a refractory metal layer, and then implanting the dopant ions through a metal layer. The amorphized regions are then melted by laser irradiation, causing the dopant atoms to quickly distribute in the melted regions. At the same time, the refractory metal reacts with the upper surfaces of the molten amorphized silicon regions to form a metal silicide. The melted source/drain regions then recrystallize to form active source/drain elements.

In related U.S. Pat. No. 6,391,731 to Chong, et. al., a process is disclosed in which both the deep source/drain regions and the shallow source/drain extensions are amorphized using two Ge, As, or Ar implantations. After dopant implantation, a single laser anneal then melts these regions and caused the dopant to distribute. After the anneal, the regions re-crystallize epitaxially from the subjacent single crystalline silicon to form highly activated, very shallow doped regions with abrupt junctions.

U.S. Pat. No. 6,897,118 to Poon et al., assigned to the present assignee, discloses a method in which shallow junctions are formed in source and drain extension regions by first performing and amorphizing implantation using a heavy ion such as silicon or germanium. The amorphizing implantation is followed by introducing a dopant, such as boron, which is activated by pulse laser annealing. The annealing is carried out just below the melting temperature of the substrate. The annealing process results in without altering the dopant concentration profile in the substrate.

While non-melt pulse laser annealing can be carried out to substantially avoid dopant diffusion in the substrate, less than satisfactory dopant activation can result. To maintain optimum electrical resistance, substantial dopant activation needs to be achieved. Accordingly, a need existed for an improved shallow junction fabrication method in which substantial dopant activation is achieved.

SUMMARY

In one embodiment, a method for forming a shallow junction region in a crystalline semiconductor substrate includes introducing first ions into a first region of the substrate. Substrate vacancies are generated in the first region, while the first region remains substantially crystalline. Also, interstitial species are generated in a second region of the substrate. Second ions are introduced into the second region of the substrate and the interstitial species are capture, thus creating a vacancy-rich surface region in the substrate.

In another embodiment, a method for fabricating a semiconductor device includes forming a gate electrode on the surface of a crystalline semiconductor substrate. First ions are implanted into a surface region of the substrate using the gate electrode as an implant mask. Substrate vacancies are generated in the surface region and interstitial species are generated in a buried region. The implantation of first ions is carried out such that the surface region remains substantially crystalline. Second ions are implanted in the buried region using the gate electrode as an implant mask and the interstitial species are captured in the buried region. Source and drain extension regions are formed adjacent to the gate electrode and a laser annealing process is carried to anneal the crystalline semiconductor substrate.

In yet another embodiment, a method for fabricating a semiconductor device includes forming an MOS device in a crystalline semiconductor substrate. The device includes source and drain regions in the substrate that are separated by a channel region. A gate electrode overlies the channel region and is separated therefrom by a gate dielectric layer. Source and drain extension regions are disposed in the substrate adjacent to the source and drain regions respectively. In the fabrication method, a defect engineering step includes implanting first ions into a surface region of the source and drain regions and generating substrate vacancies in the surface region. Interstitial species are generated in buried region of the substrate. The implantation process is carried out such that the surface region remains substantially crystalline. Sec-

DETAILED DESCRIPTION

Figure 1:
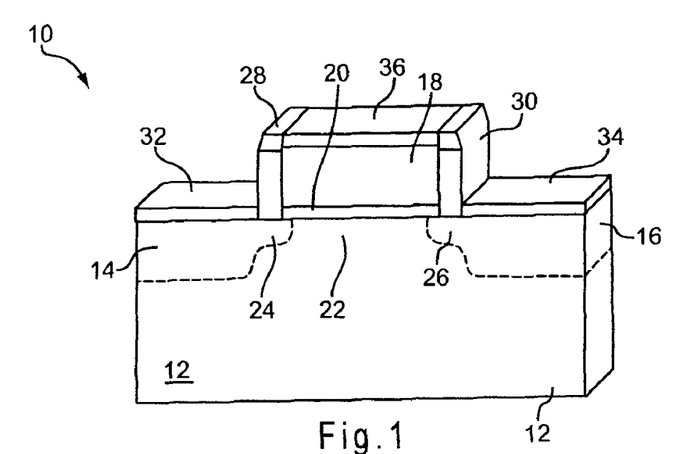
FIG. 1 illustrates, in cross-section, an MOS transistor that includes source and drain extension regions fabricated in accordance with an embodiment of the invention.

FIG. 1 illustrates, in sectional perspective view, an MOS transistor 10 fabricated in accordance with an embodiment of the invention. MOS transistor 10 is formed in a crystalline semiconductor substrate 12 in which source and drain regions 14 and 16 reside. A gate electrode 18 overlies semiconductor substrate 12 and is separated therefrom by a gate dielectric layer 20. A channel region 22 underlies gate dielectric layer 20 in semiconductor substrate 12 and extends between source region 14 and drain region 16. Source and drain extension regions 24 and 26 reside in semiconductor substrate 12 adjacent to source regions 14 and drain regions 16, respectively. Sidewall spacers 28 and 30 are positioned on the sidewalls of gate electrode 18 and overlie source and drain extension regions 24 and 26, respectively. Silicide regions 32 and 34 reside at the surface of the semiconductor substrate 12 and overlie the source and drain regions 14 and 16, respectively. A silicide region 36 overlies gate electrode 18.

In accordance with an embodiment of the invention, source and drain extension regions 24 and 26 include ultra-shallow junctions in semiconductor substrate 12. Source and drain junctions regions 24 and 26 are created using a defect engineering process that enables source and drain extension regions 24 and 26 to have a relatively low sheet resistance with high activation of dopant species and junction depths $(x_j)$ on the order of about 15 nm or less. As will subsequently be described, the defect engineering process creates a vacancy-rich surface region in which source and drain extensions 24 and 26 are formed.

Figure 2:
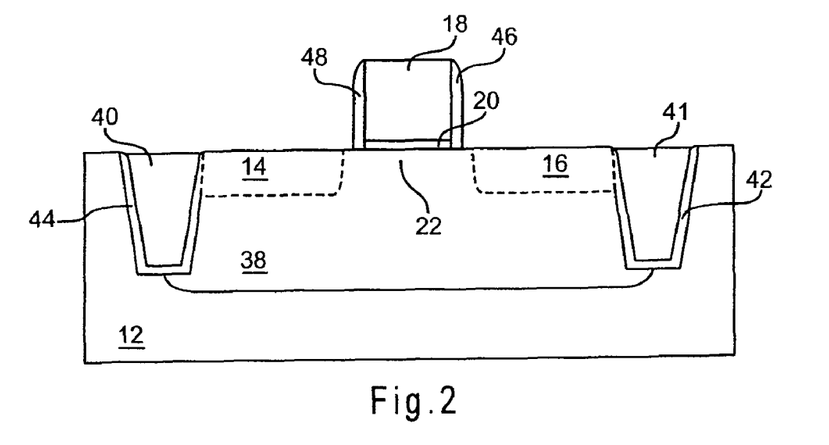
FIG. 2 illustrates, in cross-section, a semiconductor substrate having already undergone several fabrication steps in accordance with the one process embodiment of invention.

FIG. 2 illustrates, in cross-section, a portion of semiconductor substrate 12 having already undergone several steps in accordance with a process embodiment of the invention. Source and drain regions 14 and 16 are formed in a well region 38 in semiconductor substrate 12. Isolation regions 40 and 41 plank well region 38 at the surface of semiconductor substrate 12. In the illustrated embodiment, isolation regions 40 and 41 are shallow trench isolation regions in which an electrically insulating material is deposited into a lined trench within semiconductor substrate 12. A suitable dielectric material, such as silicon nitride, and the like, is conformingly deposited in the trenches to form liners 42 and 44. An insulating dielectric material, such as silicon oxide and the like, is blanket deposited onto the surface of semiconductor substrate 12 and planarized to form electrically isolating bodies filling the trenches in semiconductor substrate 12. In preparation for the defect engineering process according to an aspect of the invention, offset spacers 46 and 48 are formed along the sidewalls of gate electrode 18.

Figure 3:
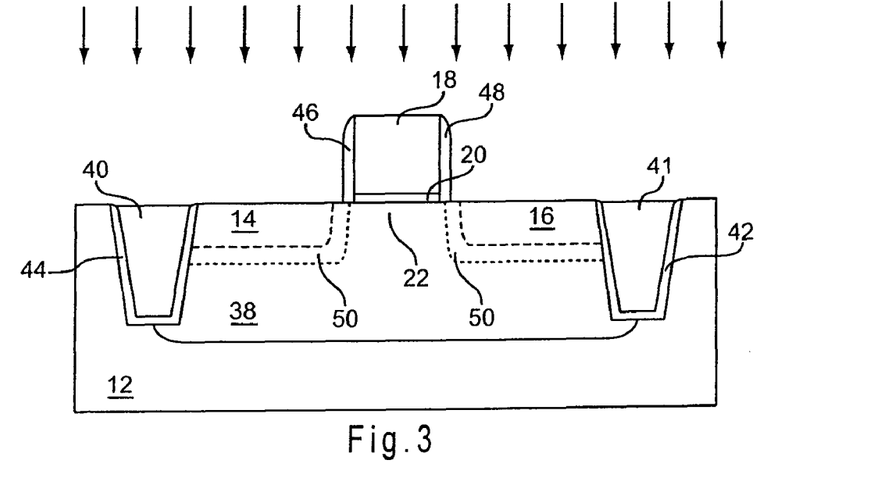
FIG. 3 illustrates, in cross-section, a defect engineering step in accordance with the embodiment of the invention in which non-amorphizing ion implantation is carried out.

In accordance with one aspect of the invention, a vacancy-rich surface region 50 is created in semiconductor substrate 12, as illustrated in FIG. 3. To form surface region 50, a first implant step is carried out in which selected species are introduced into semiconductor substrate 12 that generate defects or vacancies in the crystalline lattice of semiconductor substrate 12. The vacancies are created by dislodging the crystalline elements from their lattice sites and thus creating vacancies in the long range order of the crystalline lattice. Many different ionic species can be used in the defect generation step to create vacancies in a crystalline semiconductor material. In accordance with one embodiment of the invention, one or more of silicon or germanium ions are implanted into a silicon semiconductor substrate to generate vacancies. Those skilled in the art will appreciate that other ionic species can be used depending upon the particular semiconductor material forming crystalline semiconductor substrate 12.

Figure 4:
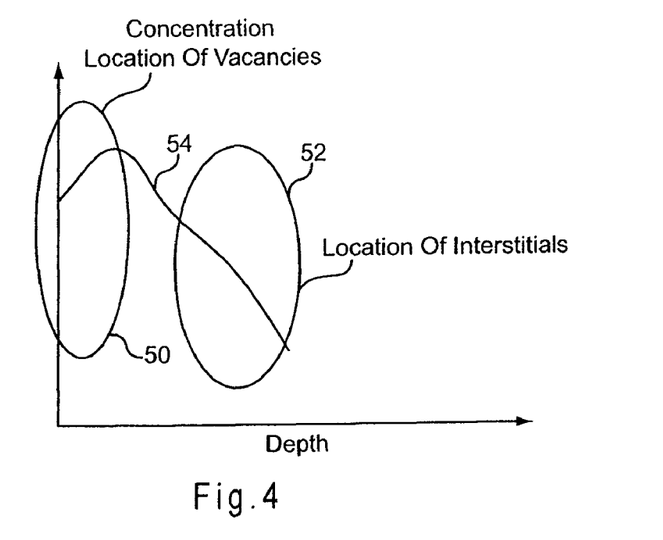
FIG. 4 is a plot illustrating the location of vacancies and interstitials in a crystalline semiconductor substrate following the implantation step illustrated in FIG. 3.

During the creation of vacancies in the surface region, interstitial species are dislodged in the surface region and accumulate in a buried region within semiconductor substrate. The interstitials typically are found at depths in substrate 12 below the surface region. FIG. 4 illustrates a plot of concentration versus depth and schematically illustrates the location of a vacancy-rich surface region 50 and a buried interstitial region 52. A vacancy concentration profile 54 shows the relatively high concentration of vacancies near the surface of semiconductor substrate 12 and a diminishing vacancy concentration at deeper levels within semiconductor substrate 12.

In accordance with the defect engineering aspect of the invention, a second implantation step is carried out to introduce ions that will bond with the interstitials. Preferably, the second species are electrically neutral and will chemically or electrically bond with the interstitial species. Preferably, electrically neutral species including one or more of carbon or fluorine are implanted in the semiconductor substrate 12 to capture the interstitial species generated during the formation of vacancy-rich surface region 50.

The first implantation that creates vacancies is carried out such that semiconductor substrate 12 remains substantially crystalline. In other words, implant conditions are controlled to avoid amorphizing the surface region of the substrate. By avoiding the amorphization of the substrate, a relatively high doping concentration can be maintained in the surface region, which results in relatively low sheet resistance. In accordance with one aspect of the invention, vacancy-rich surface region 50 is created by implantation at a dose of between about 10E13 to about 10E15 ions/cm$^2$ and an implantation energy of about 10 to about 200 keV. Those skilled in the art will recognize that the particular implantation dose and energy will vary depending upon the particular species being implanted and the particular crystalline structure of semiconductor substrate 12. Further, provisions can be made for substrate temperature control during the ion implantation process.

In accordance with various embodiments of the invention, the vacancy generation implantation step can be carried out before the interstitial capture implantation. These implantation steps can be carried out sequentially or with intermediate processing steps. Alternatively, the vacancy generation implantation step and the interstitial capture implantation step can be carried out simultaneously.

Figure 5:
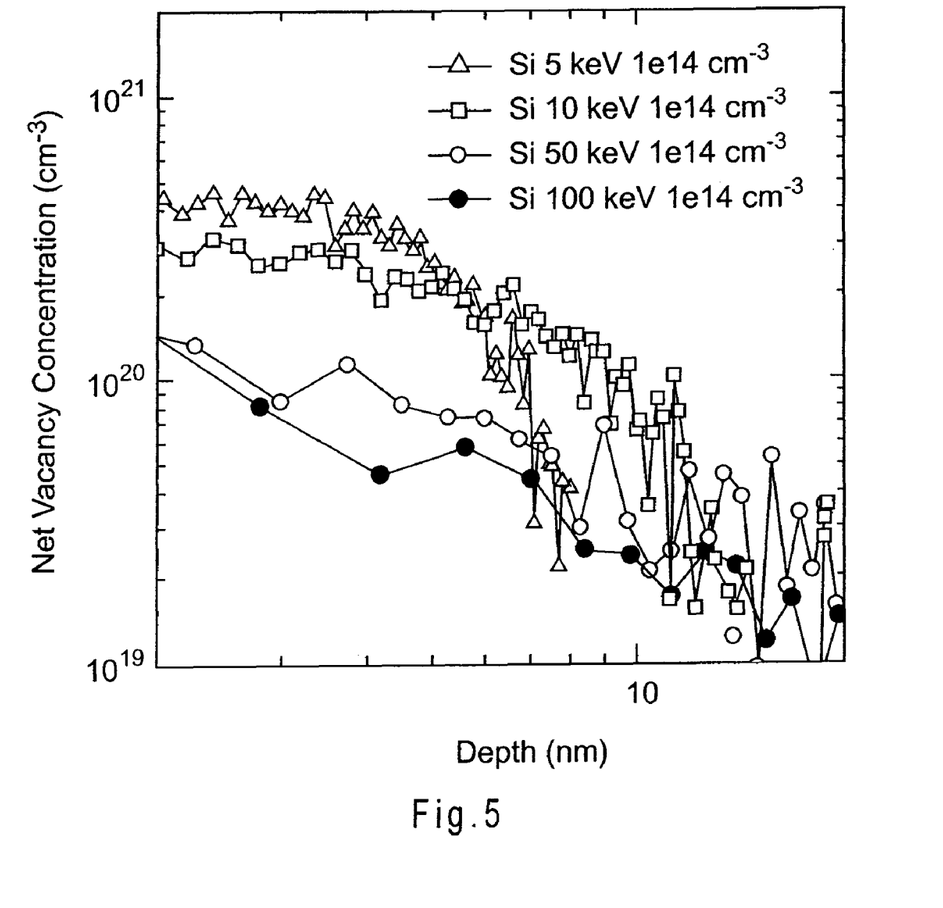
FIG. 5 is a plot of net vacancy concentration versus depth illustrating the depth profile of vacancies created by different ion implantation conditions carried in accordance with various embodiments of the invention.

FIG. 5 illustrates a plot of vacancy concentration versus depth for silicon ion implantation at energies ranging from 5 to 100 keV and an implantation dose of 10E14 ions/cm$^2$. The plot indicates that a majority of the vacancies reside within about 10 nm from the surface of semiconductor substrate 12. In the vacancy generation step, relatively high ion implant energies are used to effectively dislodge lattice points and create vacancies.

In the second implantation step, species are implanted that are electrically neutral and that will bond electrically or chemically with the interstitials in buried region 52. The implant dose depends on a number of factors, including the efficiency of the implanted species at capturing interstitials, and the amount of defects generated during the defect generation step. In one embodiment, carbon is implanted at a dose of about 10E13 ions/cm$^2$ to about 10E15 ions/cm$^2$. Further, fluorine is preferably implanted with a dose of about 10E14 ions/cm$^2$ to about 10E16 ions/cm$^2$. Both carbon and fluorine can be implanted at an energy of about 10 to about 30 keV.

Figure 6:
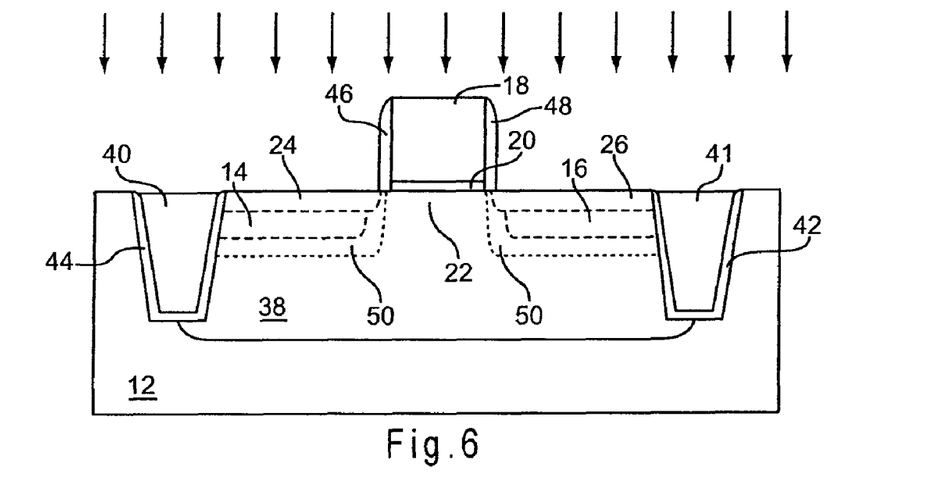
FIG. 6 is a cross-sectional view illustrating the formation of source and drain extension regions in accordance with an embodiment of the invention.

Once vacancy-rich surface region 50 is formed, source and drain extension regions 24 and 26 are formed as illustrated in FIG. 6. The source and drain extension regions are formed by ion implantation of a dopant species using gate electrode 18 and offsets sidewall spacers 46 and 48 as an implant mask. The source and drain extension regions can be formed by a variety of dopant species depending upon the particular type of semiconductor material forming semiconductor substrate 12. For example, where semiconductor substrate 12 is silicon, p-type source and drain extension regions can be formed by ion implantation of boron. In one embodiment, boron is implanted at an energy of about 0.5 keV and a dose of about 10E15 ions/cm$^2$. Alternatively, for an n-type device, the source and drain extension regions can be formed by an implantation of phosphorous and arsenic.

Figure 7:
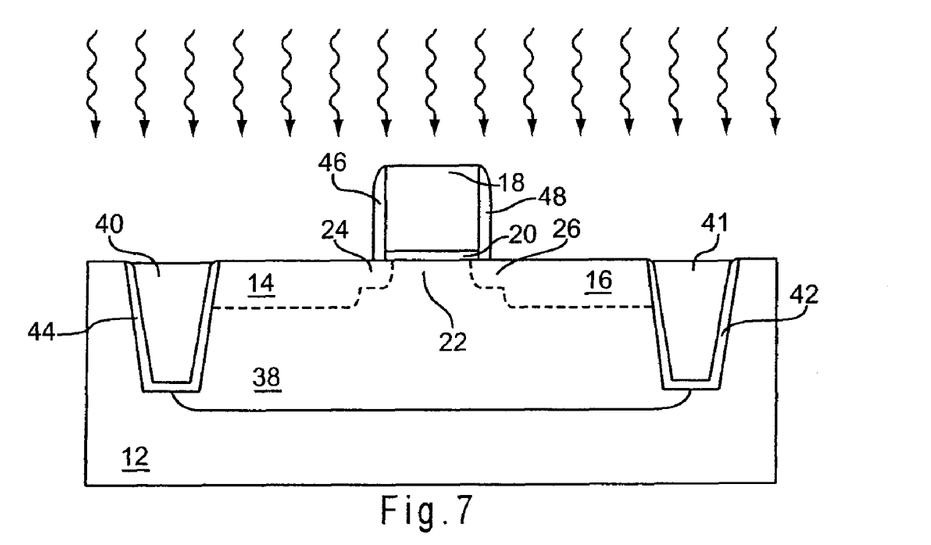
FIG. 7 illustrates the substrate of FIG. 6 undergoing non-melt laser annealing in accordance with an embodiment of the invention.

After forming source and drain extension regions 24 and 26, a non-melt laser annealing process is carried out to activate the dopant atoms in the source and drain extension regions. As illustrated in FIG. 7, semiconductor substrate 12 is subjected to laser pulses that raise the temperature of semiconductor substrate 12 to a level below the melting point of the semiconductor material.

The pulse laser annealing processes is preferably carried out at an intensity of between about 0.4 to about 0.6 J/cm$^2$. The laser preferably emits light at a wavelength of about 248 nm. The number of pulses is dependent upon the energy of the laser and the duration of each pulse. In one embodiment of the invention, only a single pulse is used at an intensity of about 0.6 J/cm$^2$. The single pulse process is possible because of the number of vacancies created in the defect engineering process described above. Alternatively, about 200 pulses can be used at an energy of about 0.5 J/cm$^2$. In either case, the laser annealing produces activated source and drain extension regions having very low leakage current levels.

As described above, the defect engineering process creates vacancies in the crystalline lattice structure of the semiconductor substrate. The thermal activation is efficient in activating the dopants introduced after the defect engineering process because the dopants can easily occupy the lattice vacancies. Thus, a substantially high percentage of the dopant atoms assume lattice positions during the annealing process and are not prone to diffusion through the lattice during the subsequent thermal cycles applied in subsequent fabrication steps.

Figure 8:
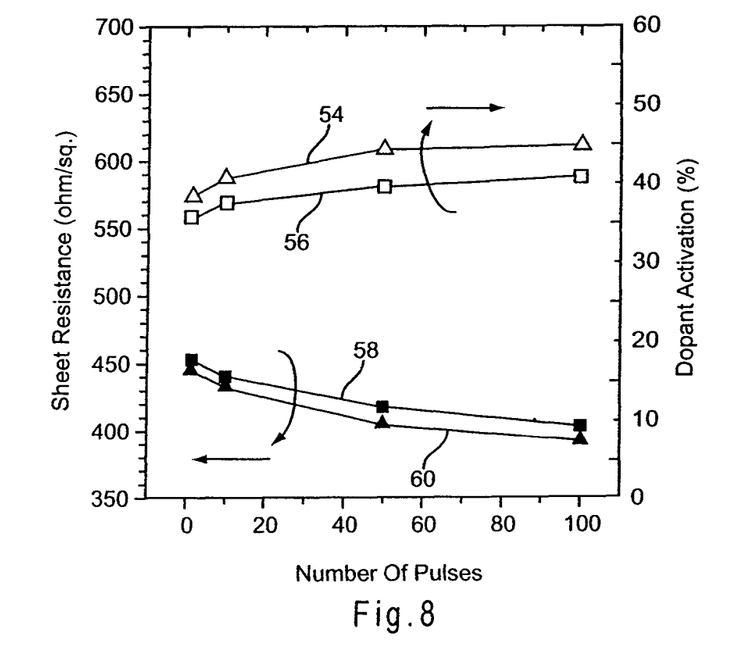
FIG. 8 is a comparison plot of sheet resistance versus pulse count illustrating a comparison of sheet resistance and dopant activation for substrates processed in accordance with an embodiment of the invention and in accordance with the prior art.

FIG. 8 illustrates a comparison plot of sheet resistance versus pulse count and dopant activation percentage versus pulse count for source and drain extension regions fabricated in accordance with an embodiment of the current invention versus source and drain extension regions fabricated in accordance with the prior art. As illustrated in FIG. 8, both sheet resistance and dopant activation are improved in source and drain extension regions fabricated in accordance with the invention. In particular, line 54 (with defect engineering) indicates higher dopant activation across a broad laser pulse count range as compared with dopant activation levels indicated by line 56 (without defect engineering). Further, line 58 (without defect engineering) indicates higher sheet resistance across a broad laser pulse count range as compared with line 60 (with defect engineering). Accordingly, source and drain extension regions fabricated in accordance with the invention exhibit improved dopant activation in the surface region of the substrate. The improved dopant activation is indicated by lower sheet resistance as compared with prior art methods across a broad range of dopant activation annealing conditions.

Figure 9:
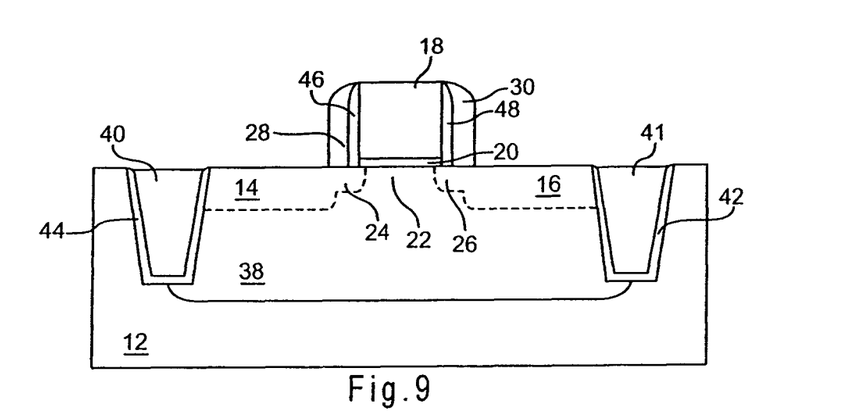
FIG. 9 illustrates, in cross-section, continued processing of the substrate illustrated in FIG. 6 with the formation of sidewall spacers in preparation for silicide formation in accordance with an embodiment of the invention.

Once source and drain extension regions 24 and 26 are formed, in the illustrated embodiment, sidewall spacers 28 and 30 are formed over sidewall spacers 46 and 48, respectively, as illustrated in FIG. 9. Then, a silicidation process is carried out to form refractory-metal silicide regions 32, 34, and 36 as illustrated in FIG. 1. Those skilled in the art will appreciate that various types of silicide regions can be formed by exposing a silicon surface to a refractory metal deposition process, then converting the interface to a silicide material. Further, different materials and methods can be used to form the sidewall spacers. Moreover, the dual spacer forming process is optional and the need for an additional sidewall spacer will depend upon the lateral distance of the source and drain extension regions along the substrate surface.

Thus, there has been described, a method performing a shallow junction region in a crystalline semiconductor substrate and a method for fabricating a semiconductor device that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, a wide variety of materials and processes can be used to fabricate the MOS device described above. In particular, a number of materials can be used to form sidewall spacers on the gate electrode, so long as the material is differentially etchable with respect to the underlying layers. Therefore, included within the invention are all such variations and modifications that fall within the scope of the appended claims and equivalents thereof.

The invention claimed is:

1. A method for forming a shallow junction region in a crystalline semiconductor substrate, the method comprising:
    introducing first ions into a first region of the substrate and generating substrate vacancies in the first region and generating interstitial species in a second region, wherein the first region remains substantially crystalline; and
    introducing second ions into the second region of the substrate and capturing the interstitial species,
    whereby a vacancy-rich surface region is created in the substrate.

2. The method of claim 1, further comprising introducing dopant species into the vacancy-rich surface region and forming an ultra-shallow junction in the first region.

3. The method of claim 2, wherein introducing first ions comprises introducing one or more of silicon or germanium.

4. The method of claim 2, wherein introducing first ions comprises introducing ions at a dose of about 10E13 to 10E15 ions per square centimeter and at an energy of about 10 to about 200 KeV.

5. The method of claim 1, wherein introducing second ions comprises introducing electrically neutral species.

6. The method of claim 5, wherein introducing second ions comprises introducing one or more of carbon or fluorine.

7. The method of claim 1 further comprising laser annealing the substrate such that the substrate temperature remains below the melting point of the substrate material.

8. The method of claim 1 further comprising:
    forming a gate electrode on a surface of the crystalline semiconductor substrate;
    forming source and drain extension regions adjacent to the gate electrode; and
    laser annealing the crystalline semiconductor substrate.

9. The method of claim 8, wherein introducing first ions comprises implanting one or more of silicon or germanium.

10. The method of claim 9, wherein introducing first ions comprises implanting ions at a dose of about 10E13 to 10E15 ions per square centimeter and at an energy of about 10 to about 200 KeV.

11. The method of claim 8, wherein introducing second ions comprises introducing electrically neutral species.

12. The method of claim 11, wherein introducing second ions comprises implanting species configured to chemically or electrically bond with the interstitial species.

13. The method of claim 8, wherein introducing second ions comprises implanting one or more of carbon or fluorine.

14. The method of claim 8, wherein laser annealing comprises pulsed laser annealing, and wherein the substrate temperature remains below the melting point of crystalline semiconductor material forming the crystalline semiconductor substrate.

15. The of claim 1 further comprising:
    forming an MOS device in the crystalline semiconductor substrate, the device including source and drain regions in the substrate separated by a channel region, a gate electrode overlying the channel region and separated therefrom by a gate dielectric layer, and source and drain extension regions in the substrate adjacent to the source and drain regions.

16. The method of claim 15 further comprising laser annealing the substrate to activate the source and drain extension regions, wherein the substrate temperature remains below the melting point of a crystalline semiconductor material forming the crystalline semiconductor substrate.

17. The method of claim 16 further comprising forming silicide regions at a surface region.

18. The method of claim 16, wherein introducing first ions comprises introducing one or more of silicon or germanium and introducing second ions comprises introducing one or more of carbon or fluorine.

19. The method of claim 16, wherein introducing second ions comprises introducing electrically neutral species that chemically or electrically bond with the interstitial species.

20. A method, for forming a shallow junction region in a crystalline semiconductor substrate, the method comprising:
    introducing first ions into a first region of the substrate and generating substrate vacancies in the first region and generating interstitial species in a second region, wherein the first region remains substantially crystalline; and
    introducing second ions into the second region of the substrate and capturing the interstitial species,
    whereby a vacancy-rich surface region is created in the substrate
    wherein introducing second ions comprises introducing electrically neutral species that chemically or electrically bond with the interstitial species.

* * * * *

UNITED STATES PATENT AND TRADEMARK OFFICE
CERTIFICATE OF CORRECTION

PATENT NO. : 7,888,224 B2  Page 1 of 1
APPLICATION NO. : 12/271262
DATED : February 15, 2011
INVENTOR(S) : Kuang Kian Ong et al.

It is certified that error appears in the above-identified patent and that said Letters Patent is hereby corrected as shown below:

In the Claims

In column 8, claim 15, line 8, before "of claim 1 further comprising:" insert --method--.

Signed and Sealed this
Third Day of July, 2012

David J. Kappos
*Director of the United States Patent and Trademark Office*